(12) United States Patent
Lu et al.

(10) Patent No.: US 8,859,882 B2
(45) Date of Patent: Oct. 14, 2014

(54) SOLID STATE HEAT PIPE HEAT REJECTION SYSTEM FOR SPACE POWER SYSTEMS

(75) Inventors: Cheng-Yi Lu, West Hills, CA (US); James A. McClanahan, Woodland Hills, CA (US); Joseph P. Carroll, Moorpark, CA (US); William Determan, Sylmar, CA (US); Patrick E. Frye, Simi Valley, CA (US); Charles Thomas Kudija, Santa Clara, CA (US); Rick L. Howerton, Simi Valley, CA (US); Kenneth John Metcalf, Simi Valley, CA (US); Andrew J. Zillmer, Woodland Hills, CA (US)

(73) Assignee: Aerojet Rocketdyne of DE, Inc., Sacramento, CA (US)

( * ) Notice: Subject to any disclaimer, the term of this patent is extended or adjusted under 35 U.S.C. 154(b) by 1735 days.

(21) Appl. No.: 12/286,480

(22) Filed: Sep. 30, 2008

(65) Prior Publication Data
US 2010/0078061 A1 Apr. 1, 2010

(51) Int. Cl.
*H01L 31/052* (2014.01)
*F28D 15/00* (2006.01)

(52) U.S. Cl.
USPC ............ 136/246; 165/104.13; 165/104.14; 165/104.15; 165/104.16; 165/104.17; 165/104.18; 165/173; 165/181; 165/185

(58) Field of Classification Search
USPC ........ 136/246; 165/104.15–104.18, 173, 181, 165/185
See application file for complete search history.

(56) References Cited

U.S. PATENT DOCUMENTS

| 4,155,346 | A | * | 5/1979 | Aresty | 126/652 |
|---|---|---|---|---|---|
| 4,273,365 | A | * | 6/1981 | Hagar | 285/229 |
| 4,830,678 | A | | 5/1989 | Todorof et al. | |
| 4,901,792 | A | * | 2/1990 | Komiya | 165/150 |
| 4,947,825 | A | * | 8/1990 | Moriarty | 126/685 |
| 5,269,851 | A | | 12/1993 | Horne | |
| 5,340,165 | A | * | 8/1994 | Sheppard | 285/226 |
| D425,611 | S | | 5/2000 | Qu | |
| 6,080,927 | A | | 6/2000 | Johnson | |
| 6,132,823 | A | | 10/2000 | Qu | |
| 6,811,720 | B2 | | 11/2004 | Qu | |
| 6,911,231 | B2 | | 6/2005 | Qu | |
| 6,916,430 | B1 | | 7/2005 | Qu | |
| 7,220,365 | B2 | | 5/2007 | Qu et al. | |
| 2002/0074034 | A1 | | 6/2002 | Fujisaki et al. | |
| 2002/0121298 | A1 | | 9/2002 | Konold | |
| 2003/0030029 | A1 | | 2/2003 | Qu | |
| 2003/0066638 | A1 | | 4/2003 | Qu et al. | |
| 2004/0025931 | A1 | | 2/2004 | Aguglia | |
| 2005/0056807 | A1 | | 3/2005 | Qu | |
| 2005/0081908 | A1 | | 4/2005 | Stewart | |

(Continued)

Primary Examiner — Matthew Martin
(74) Attorney, Agent, or Firm — Carlson, Gaskey & Olds, P.C.

(57) ABSTRACT

A heat rejection system includes a plurality of panel subassemblies and a solid state heat pipe flex joint. Each panel subassembly includes a fin, a solid state heat pipe manifold, a first solid state heat pipe tube operatively connected to the solid state heat pipe manifold and secured to the fin, a second solid state heat pipe tube operatively connected to the solid state heat pipe manifold adjacent to the first solid state heat pipe and secured to the fin. The solid state heat pipe flex joint operably connects the solid state heat pipe manifolds of two of the plurality of panel subassemblies in a hermetically sealed configuration, and is configured to permit repositioning of the two panel subassemblies relative to each other.

24 Claims, 10 Drawing Sheets

(56) References Cited

U.S. PATENT DOCUMENTS

| | | |
|---|---|---|
| 2005/0133082 A1 | 6/2005 | Konold et al. |
| 2006/0005947 A1 | 1/2006 | Arik et al. |
| 2006/0065317 A1* | 3/2006 | Higgins et al. ............... 137/884 |
| 2006/0124276 A1 | 6/2006 | Curtis |
| 2007/0215198 A1 | 9/2007 | Yirong et al. |
| 2007/0262204 A1* | 11/2007 | Beidleman et al. ......... 244/172.6 |
| 2008/0156455 A1* | 7/2008 | Powers et al. .................. 165/67 |
| 2010/0252245 A1* | 10/2010 | Yang et al. .................... 165/181 |

\* cited by examiner

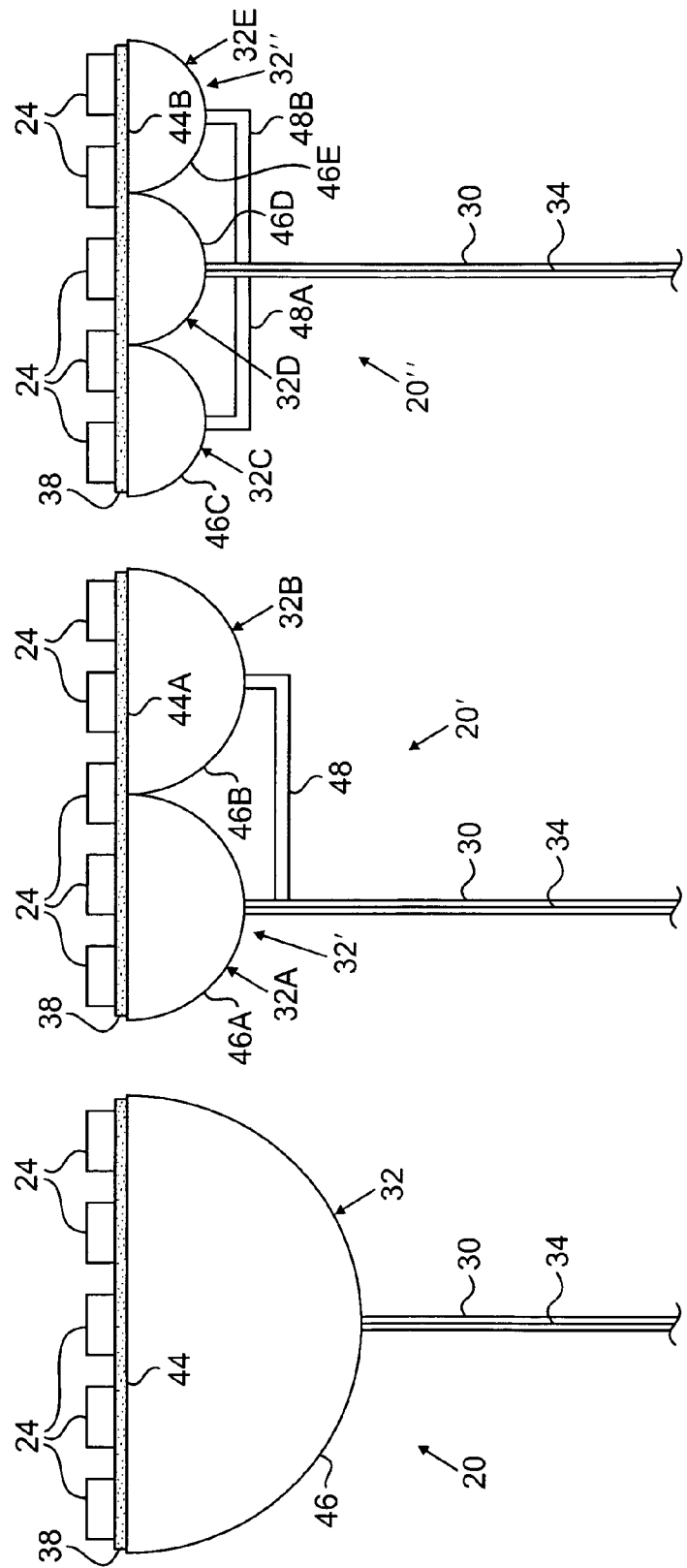

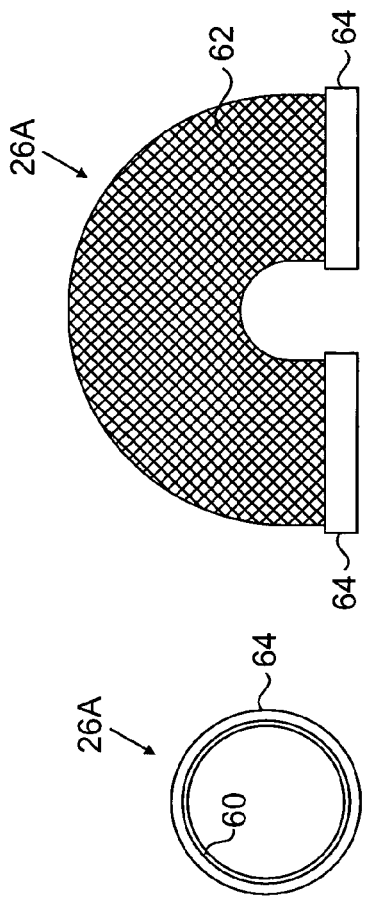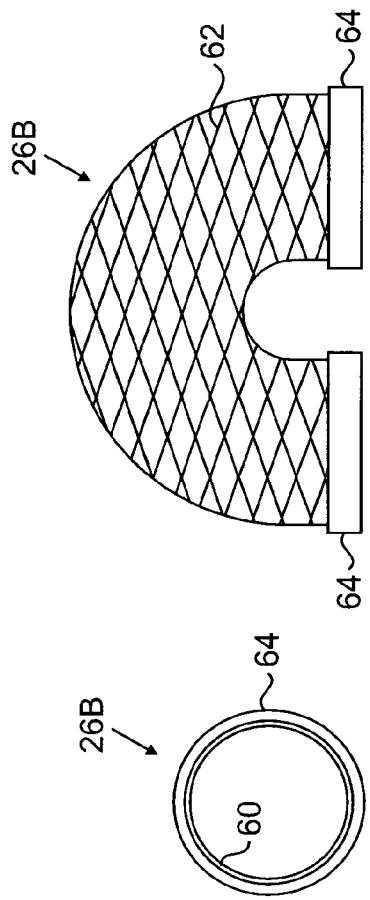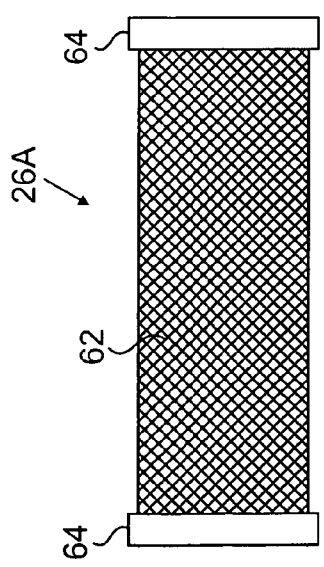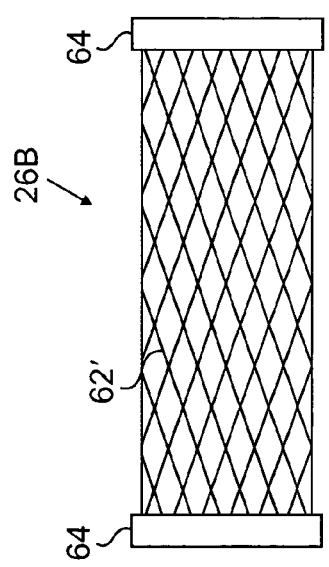
FIG. 8A  FIG. 8B  FIG. 8C
FIG. 9A  FIG. 9B  FIG. 9C

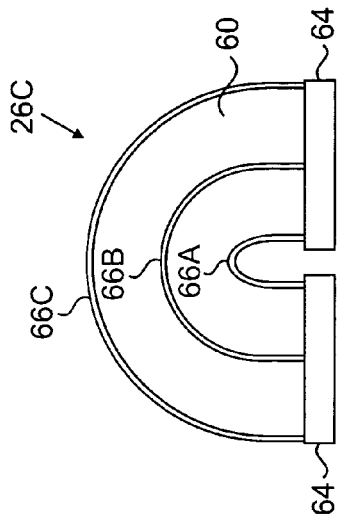
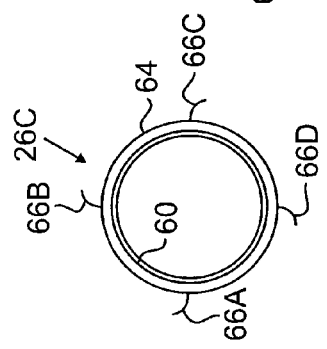
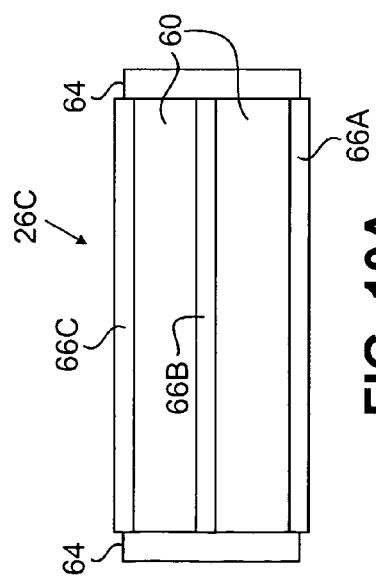
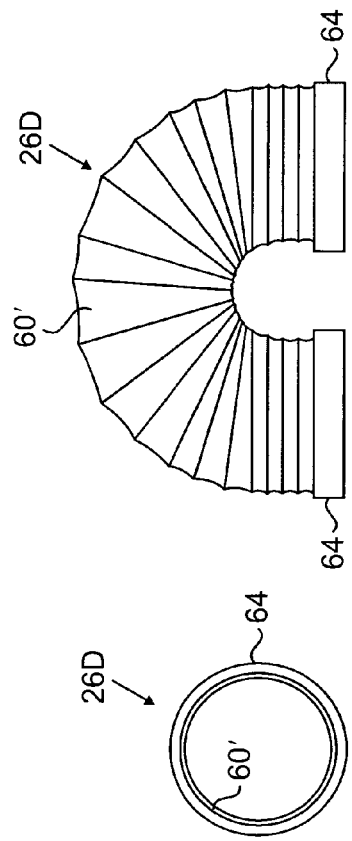
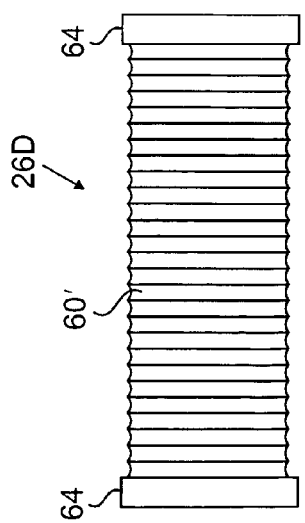
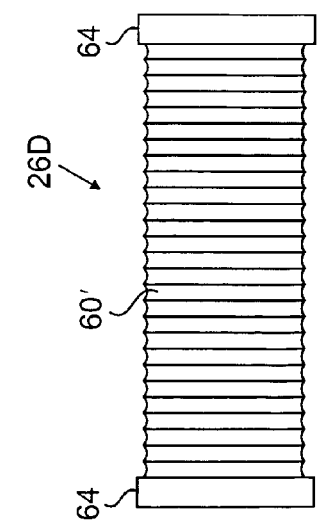

SOLID STATE HEAT PIPE HEAT REJECTION SYSTEM FOR SPACE POWER SYSTEMS

BACKGROUND

The present invention relates generally to heat rejection systems, and more particularly to solid state heat rejection systems for use in space.

Systems designed for operation in space often require heat rejection capabilities. For instance, space vehicles and satellites often utilize photovoltaic power systems that can generate waste heat. Photovoltaic systems utilizing solar concentrators can generate particularly large amounts of waste heat. It is desirable to provide for rapid transfer of thermal energy for dissipation, and to accommodate the transfer of relatively large amounts of thermal energy. However, there are numerous difficulties in providing suitable heat rejection.

Systems designed for operation in space must be able to be launched to an orbital or sub-orbital altitude. For satellite systems, this generally involves storage within a launch vehicle payload fairing prior to deployment in space. Launch vehicle payload fairings provide limited payload space, often as a conical or bell-shaped volume. Therefore it is desirable for heat rejection systems to be relatively compact (i.e., to occupy a relatively small volume) when stowed for launch.

Launch vehicles and their fuels are highly expensive, and are frequently expendable. Therefore, it is also desirable to reduce the mass of launch payloads, in order to help reduce the size and cost associated with the launch vehicle. In this context, the mass of heat rejection systems is important. Heat rejection systems that would otherwise operate suitably once in space may be unworkable for practical applications because they would add too much mass to the launch vehicle's payload. There may even be a maximum feasible mass limit imposed upon heat rejection systems for some applications.

Additional difficulties limit heat rejection systems. Such systems must be able to function in a zero- or low-gravity environment. It is also desirable for heat rejection systems to have a wide thermal operation range, and to limit failure modes. Some prior art systems utilize two-phase heat pipes, which transfer thermal energy between condenser and evaporator sections using a working medium that changes back and forth between liquid and gaseous states during operation. However, those prior art systems are heavy and bulky, particularly due to the evaporator and condenser sections, and can cease functioning in certain temperature ranges, such as if the working medium freezes. Those systems can also require undesirably complex internal mechanisms to ensure proper functioning in a low-gravity environment, for instance, requiring active working medium pumping systems.

SUMMARY

A heat rejection system includes a plurality of panel subassemblies and a solid state heat pipe flex joint. Each panel subassembly includes a fin, a solid state heat pipe manifold, a first solid state heat pipe tube operatively connected to the solid state heat pipe manifold and secured to the fin, a second solid state heat pipe tube operatively connected to the solid state heat pipe manifold adjacent to the first solid state heat pipe and secured to the fin. The solid state heat pipe flex joint operably connects the solid state heat pipe manifolds of two of the plurality of panel subassemblies in a hermetically sealed configuration, and is configured to permit repositioning of the two panel subassemblies relative to each other.

BRIEF DESCRIPTION OF THE DRAWINGS

FIG. 3 is a side elevation view of the space power system of FIG. 1.

FIG. 4 is a side elevation view of an alternative embodiment of the space power system.

FIG. 5 is a side elevation view of another alternative embodiment of the space power system.

FIGS. 8A-11C are views of alternative embodiments of a flex joint for use with the heat rejection subsystem.

DETAILED DESCRIPTION

In general, the present invention provides a heat rejection and heat transfer system for use in space, such as with space power systems. The present invention utilizes assemblies that include solid state heat pipes (SSHPs) and other components, such as SSHP flex joints, to provide rapid thermal transfer across desired distances. These assemblies can include a plurality of individual SSHPs operably connected to SSHP manifolds, with adjacent SSHP manifolds operably connected with the SSHP flex joints. The present invention provides a number of embodiments that allow for heat rejection in space with a relatively low-mass structure that can reject relatively large amounts of thermal energy at relatively rapid rates. Additionally, the present invention allows the heat rejection system to be stowed within a relatively small volume, in order to facilitate placement within a launch vehicle payload fairing for launch into space. Other features and benefits of the present invention will be appreciated in view of the disclosure that follows.

As used herein, the term "SSHP" (i.e., "solid state heat pipe") refers to heat pipes having a heat transfer medium (or working medium) that includes a material in a solid state, and is distinguishable from prior art heat pipes that utilize a working medium designed to operate in a liquid state (e.g., ones that use water that evaporates and condenses between gaseous and liquid states). Suitable SSHPs and SSHP working media include those commercially available from New Qu Energy Ltd., Hong Kong, People's Republic of China, and those disclosed in U.S. patent application Ser. No. 11/652,840, entitled "Nano-Particle Wave Heat Pipe", which is hereby incorporated by reference in its entirety. With a typical SSHP, a cavity inside the pipe is in a partial vacuum state, and the heat transfer medium is sealed within the cavity. The heat transfer medium includes a substantially homogeneous mixture of a nano-particle powder and an associated gas (e.g., hydrogen gas, water vapor, etc.). The nano-particle powder includes a material in a solid state capable of substantially freely emitted and reabsorbing a gas as a function of temperature, such as a hydrate, hydride or other gas. Likewise, the gas is capable of being substantially freely absorbed and emitted. SSHPs can operate in zero- or near-zero-gravity environments, and do not require pumping mechanisms or particular orientations to operate.

Figure 1:
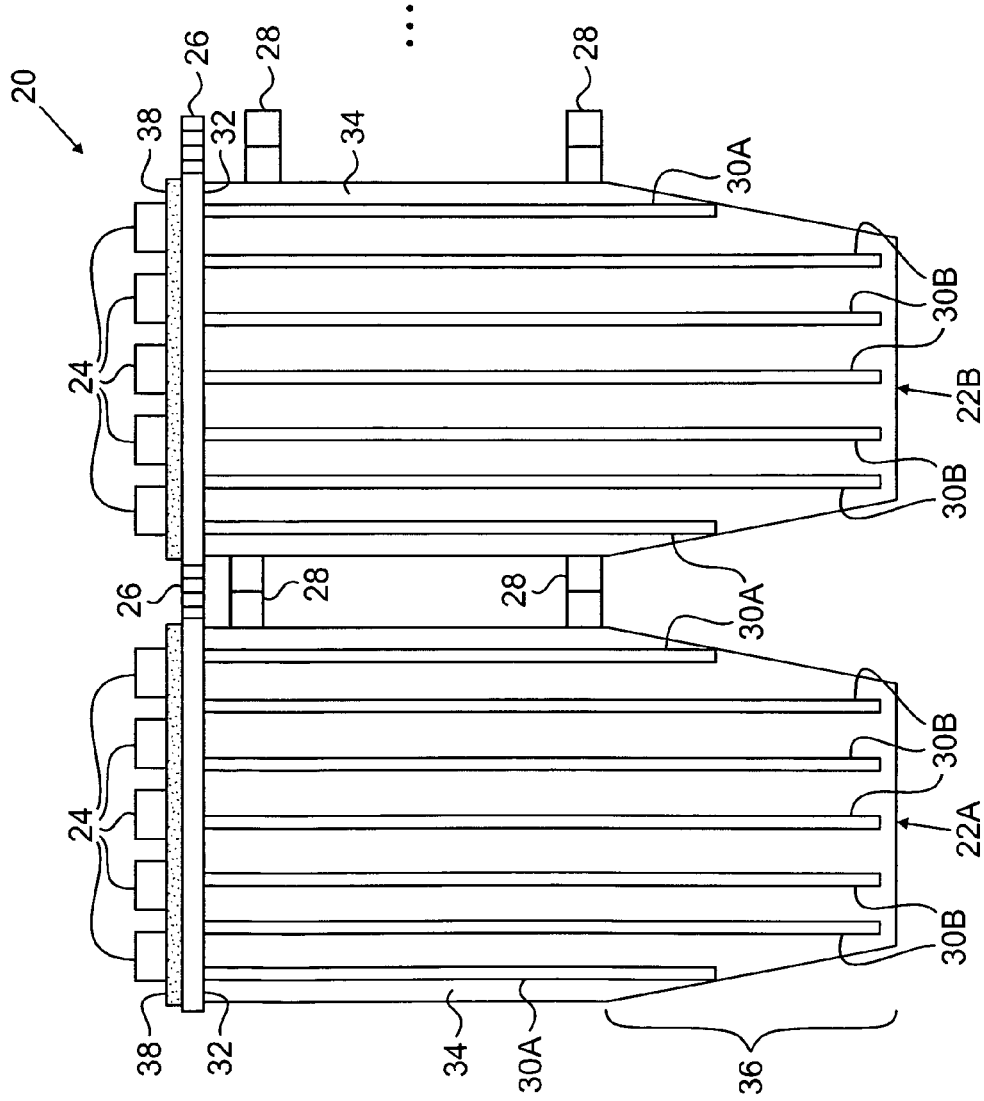
FIG. 1 is a plan view of a space power system with a heat rejection subsystem.

FIG. 1 is a plan view of a space power system 20 that includes first and second panel assemblies 22A and 22B, respectively, (collectively, the panel assemblies are referred to by reference number 22), a plurality of photovoltaic power cells (PVCs) 24, SSHP flex joints 26, and hinge assemblies 28. The panel assemblies 22 along with the SSHP flex joints 26 form a heat rejection subsystem. The panel assemblies 22 can each have a generally planar configuration.

The panel assemblies 22 each include a number of SSHPs (collectively referred to by reference number 30), a SSHP manifold 32, and a fin 34. In the illustrated embodiment, the SSHPs 30 of each panel assembly 22 include two SSHPs 30A of a shorter length and five SSHPs 30B of a longer length. The number of each type of SSHP 30 can vary as desired in further embodiments. The SSHPs 30 are operatively connected to the SSHP manifolds 32, that is, interior cavities of each are connected in fluid communication with each other such that a heat transfer medium located therein can move between the SSHP manifold 32 and the connected SSHPs 30. In the illustrated embodiment, each of the SSHPs 30 joins the associated SSHP manifold 32 at an approximately 90° angle, though in alternative embodiments the SSHPs 30 can be arranged at other angles. In the embodiment of FIG. 1, the panel assemblies 22 each have a substantially hexagonal perimeter defining a tapered portion 36. The SSHP manifolds 32 are located adjacent to the perimeter of the panel assemblies 22 opposite the tapered portions 36, and the SSHPs 30 extend from one side of each SSHP manifold 32. The SSHP manifolds 32 of the first and second panel assemblies 22A and 22B are operatively connected by one of the SSHP flex joints 26, which connects interior cavities of the SSHP manifolds 32 in fluid communication with each other and allows the heat transfer medium to pass between adjacent panel assemblies 22. The shorter SSHPs 30A are connected to opposite ends of the SSHP manifolds 32, with the longer SSHPs 30B connected to middle portions of the SSHP manifolds 32. In that configuration, the shorter SSHPs 30A are each positioned adjacent to three edges of the panel assembly perimeter. While only the first and second panel assemblies 22A and 22B are shown in FIG. 1, any number of panel assemblies 22 can be connected together in the manner described above. It should be noted that if only two panel assemblies 22 are utilized, the SSHP flex joint 26 and the hinge assemblies 28 shown at the right side of the second panel assembly 22B would be omitted.

The SSHPs 30 and the SSHP manifolds 32 can each be elongate tubular members of any desired configuration that provides a hermetically sealed interior cavity. For example, the SSHPs 30 and the SSHP manifolds 32 can have a cross-sectional shape that is circular, rectangular, elliptical, D-shaped, etc. A cross-sectional diameter of interior cavities of the SSHPs 30 and the SSHP manifolds 32 can be selected to provide a desired level of heat transfer capability.

The fin 34 comprises a web of material that facilitates heat rejection from the SSHPs 30 and the SSHP manifolds 32. The fin 34 can be made of a woven carbon fiber sheet, a carbon fiber sheet impregnated with a resin or epoxy for stiffness, or other materials. In embodiments where material of the fin 34 is not stiff, mechanical tensioners and crossbeams (not shown) can be utilized to add stiffness, spread the material of the fin 34, and to support the SSHPs 30. During operation, heat (e.g., from the PVCs 24) can be transferred through the SSHP manifolds 32 to the SSHPs 30, and then transferred to the fins 34. This process allows for relatively quick and efficient rejection of relatively large amounts of heat.

The hinge assemblies 28 mechanically connect adjacent panel assemblies 22. As explained further below, the hinge assemblies 28 permit adjacent panel assemblies 22 to be repositioned relative to each other. This can facilitate stowage within a launch vehicle payload faring. In the illustrated embodiment, two hinge assemblies 28 mechanically connect the first and second panel assemblies 22A and 22B at spaced locations along a single edge of the perimeter of the panel assemblies 22. One of the hinge assemblies 28 is located adjacent to the SSHP flex joint 26, and the other is located adjacent to the tapered portion 36.

In the illustrated embodiment, five PVCs 24 are secured to each panel assembly 22. In further embodiments, any number of PVCs 24 can be secured to each panel, or can be omitted entirely. The PVCs 24 can be devices of a known configuration suitable for generating electrical energy from light, and can be adhered to the SSHP manifolds 32 using an adhesive material 38 (e.g., Kapton® polyimide tape). Optical concentrators can be used to focus light at the PVCs 24 in some embodiments. Typically, heat will be generated at or near the PVCs 24, and it is desirable to remove excess heat from the PVCs 24.

Figure 2:
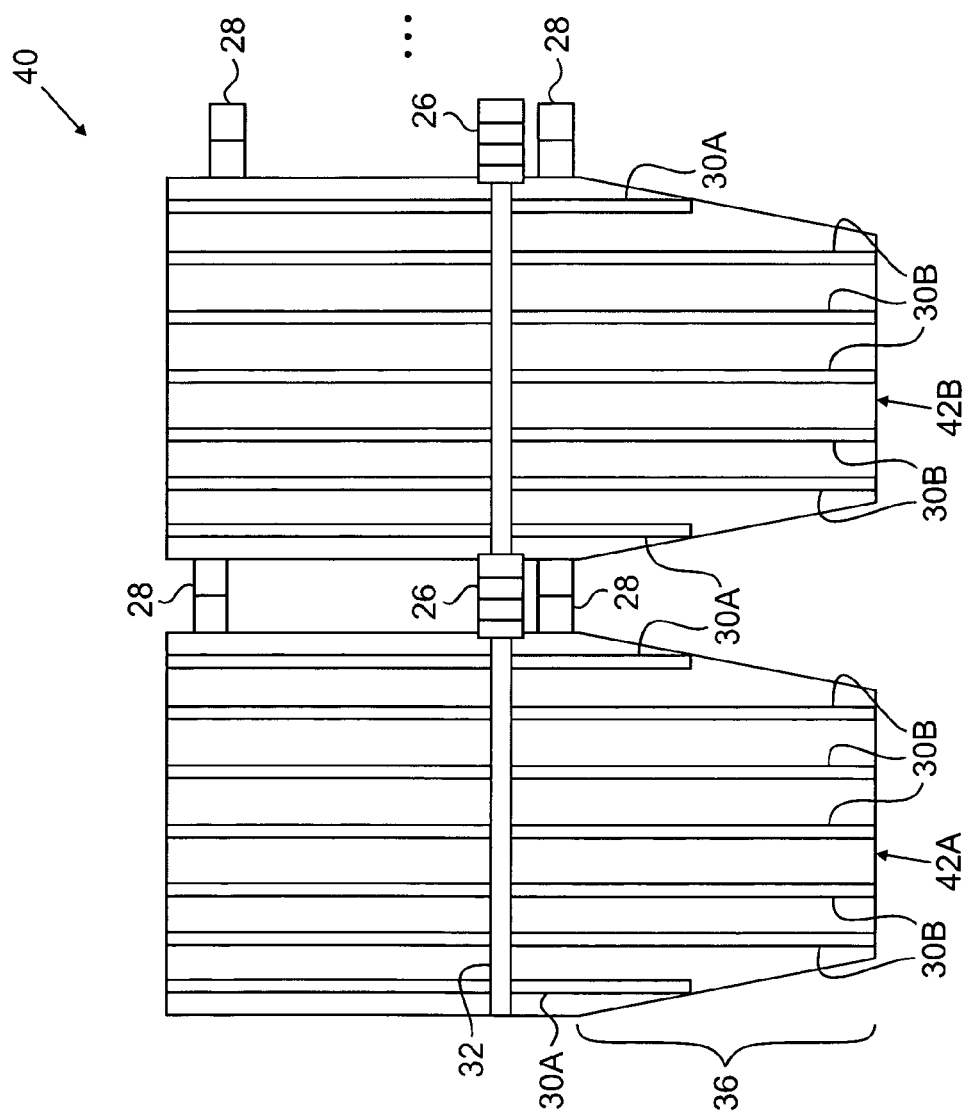
FIG. 2 is a plan view of an alternative embodiment of a heat rejection subsystem.

FIG. 2 is a plan view of an alternative embodiment of a heat rejection subsystem 40 that includes first and second panel assemblies 42A and 42B, respectively (collectively referred to as panel assemblies 42). The heat rejection subsystem 40 is generally similar to that described with respect to FIG. 1. However, the SSHP manifolds 32 in the embodiment of FIG. 2 are located in a middle region of each panel assembly 42, with the SSHPs 30 extending from opposite sides of the SSHP manifolds 32. It should also be noted that PVCs or other remote heat sources for which thermal load is carried by the SSHP manifolds 32 are not shown in FIG. 2.

FIG. 3 is a side elevation view of one embodiment of the space power system 20 of FIG. 1. In the illustrated embodiment, the SSHP manifold 32 has a "D" shape formed by a planar wall 44 and an arcuate wall 46 of a substantially semi-circular cross-section. The SSHP manifold 32 can be formed by extrusion, or other known techniques. The PVCs 24 and adhesive 38 are located along the planar wall 44 of the SSHP manifold 32. The SSHPs 30 extend from a middle portion of the arcuate wall 46 of the SSHP manifold 32, opposite the planar wall 44. The SSHPs 30 and the SSHP manifolds 32 can each be formed of a metallic material, such as titanium, or other materials. The SSHPs 30 can be joined to the SSHP manifolds 32 using brazing or other known techniques. Joints between the SSHPs 30 and the SSHP manifolds 32 should be hermetically sealed.

FIG. 4 is a side elevation view of an alternative embodiment of a space power system 20'. The system 20' is generally similar to the system 20 described with respect to FIG. 3. However, the system 20' shown in FIG. 4 has a SSHP manifold 32' in a "double D" shape with a pair of D-shaped manifold elements 32A and 32B each forming a separate internal cavity between a planar wall 44A and respective arcuate walls 46A and 46B. The D-shaped manifold elements 32A and 32B can be formed integrally in a side-by-side configuration, substantially parallel to one another. It is possible to commonly extrude the D-shaped manifold elements 32A and 32B to integrally form the SSHP manifold 32'. In the illustrated embodiment, the SSHPs 30 extend from the arcuate wall 46A of the D-shaped manifold element 32A, and a connection pipe 48 operatively connects the other D-shaped manifold element 32B to each associated SSHP 30 (see also FIG. 6). As illustrated, the connection pipe 48 has an "L" shape, though other configurations are possible in further embodiments.

FIG. 5 is a side elevation view of another alternative embodiment of a space power system 20" that is generally similar to the systems 20 and 20' described with respect to FIGS. 3 and 4. However, the system 20" shown in FIG. 5 has a SSHP manifold 32" in a "triple D" shape with three D-shaped manifold elements 32C, 32D and 32E each forming a separate internal cavity between a planar wall 44B and respective arcuate walls 46C, 46D and 46E. The D-shaped manifold elements 32C, 32D and 32E can be formed integrally, substantially parallel to one another. In the illustrated embodiment, the SSHPs 30 extend from the arcuate wall 46D of the D-shaped manifold element 32D, and connection pipes 48A and 48B operatively connect the other D-shaped manifold elements 32C and 32E, respectively, to each associated SSHP 30 at opposite sides of the SSHPs 30. As illustrated, the connection pipes 48A and 48B each have an "L" shape, though other configurations are possible in further embodiments.

Figure 6:
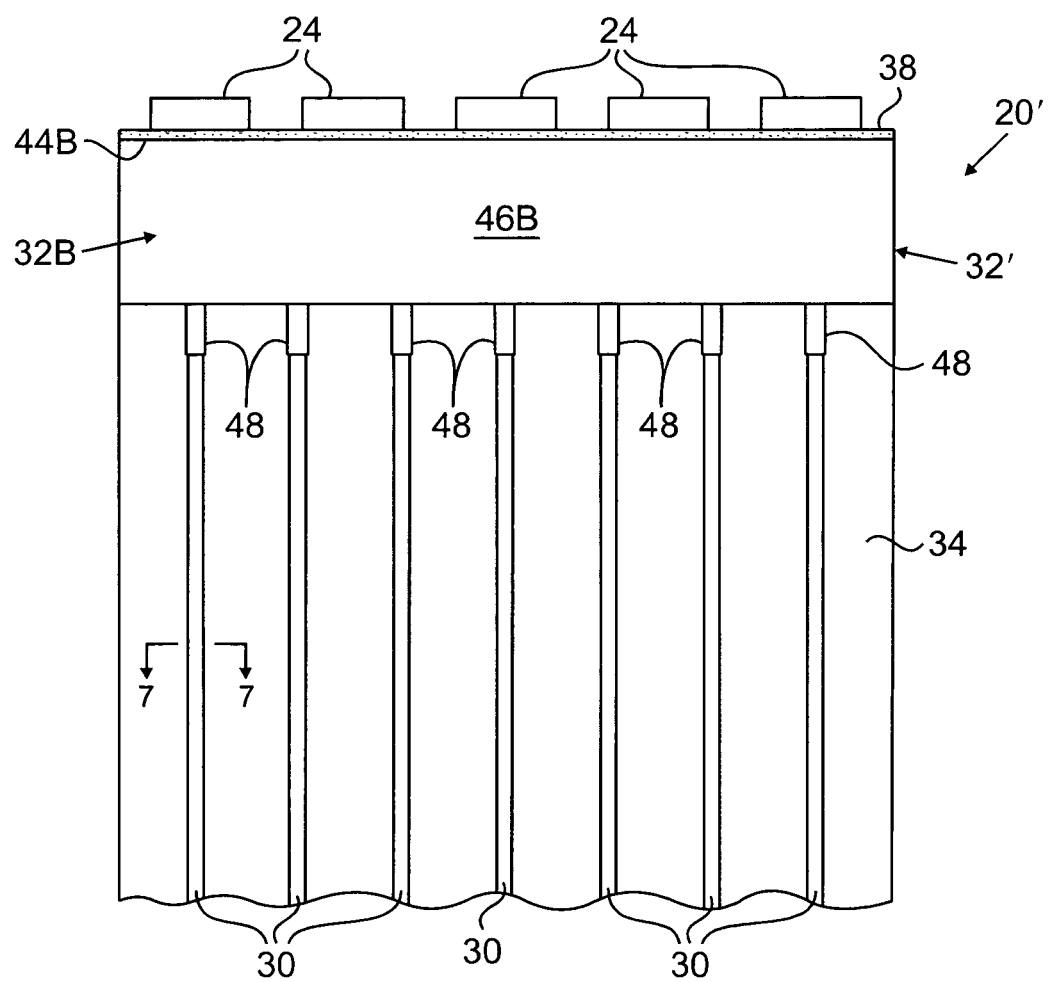
FIG. 6 is a plan view of a portion of the space power system of FIG. 4.

FIG. 6 is a plan view of a portion of the space power system 20' of FIG. 4. As shown in FIG. 6, the connection pipes 48 can connect to the SSHPs 30 relatively close to the SSHP manifold 32'.

Figure 7:
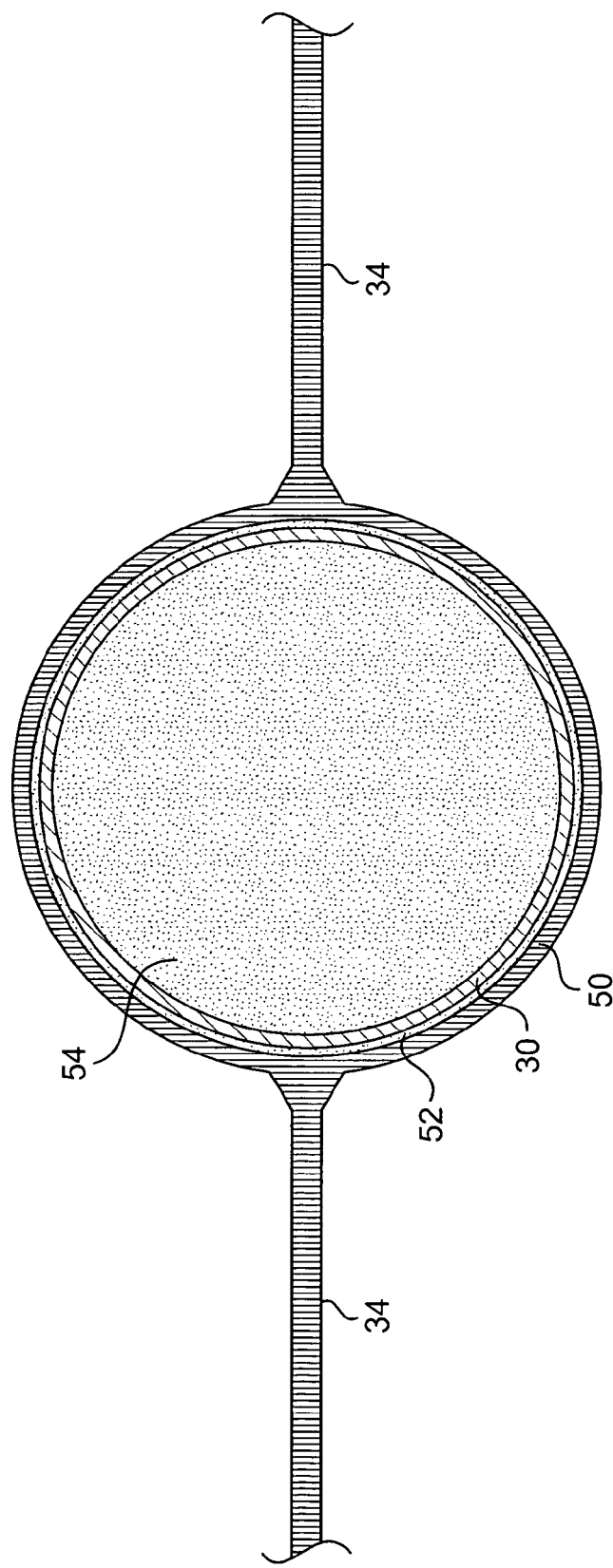
FIG. 7 is a cross-sectional view of a portion of the heat rejection subsystem of the space power system of FIG. 6, taken along line 7-7.

FIG. 7 is a cross-sectional view of a portion of the heat rejection subsystem of the space power system 20', taken along line 7-7 of FIG. 6. As shown in FIG. 7, the fin 34 is made of a woven carbon fabric having a generally planar configuration. As previously noted, the material of the fin can be impregnated or coated with an epoxy or resin, or can be stiffened by a mechanical tensioning device. The material of the fin 34 joins a retention sleeve (or retention tube) 50, that can be made of substantially the same material as the fin 34. The SSHP 30 is positioned within the retention sleeve 50, and can be secured therein by a suitable adhesive 52 (e.g., a thermal epoxy) or other material. Alternatively, the adhesive 52 can be omitted and the SSHPs 30 mechanically secured to the retention sleeve 50.

As shown in the embodiment of FIG. 7, the SSHP 30 has a generally cylindrical shape with a substantially circular cross-sectional shape. In further embodiments, the SSHP 30 can have other shapes as desired for particular applications. A heat transfer medium 54 is present in an interior cavity of the SSHP 30. The heat transfer medium includes a material in a solid state, and is distinguishable from prior art heat pipes that utilize a working medium designed to operate in a liquid state. The SSHP 30 and the heat transfer medium 54 can be one commercially available from New Qu Energy Ltd., or one of the type disclosed in U.S. patent application Ser. No. 11/652,840, entitled "Nano-Particle Wave Heat Pipe".

The SSHP flex joints 26 can have a variety of different configurations. The SSHP flex joints 26 can have a cross-sectional shape that corresponds to that of the SSHP manifolds to which they join, or can be differently shaped than the SSHP manifolds to which they are attached. It should be noted that the SSHP flex joints 26 generally include the same internal coatings as other SSHP components of the system. FIGS. 8A-11C are views of alternative embodiments of SSHP flex joints 26.

FIGS. 8A-8C show a first embodiment of a SSHP flex joint 26A that includes an inner foil 60, an outer braided layer 62, and pipe interfaces 64. FIG. 8A is a plan view of the SSHP flex joint 26A in a normal operational state. FIG. 8B is an end view of the SSHP flex joint 26A in the normal operational state, and FIG. 8C is a plan view of the SSHP flex joint 26A in a folded state. The inner foil 60 can be a thin layer of material configured in a substantially cylindrical shape to form an interior cavity, and capable of elastically deforming to the folded state and returning to the normal operational state in substantially its original shape. The inner foil 60 can be made of a metallic material, a polymer material, etc. In applications where out-gassing is a concern, metallic materials may be more effective than polymers. Furthermore, the inner foil 60 can have a wall thickness of about 25.4-127 µm (1-5 mils), or other thicknesses in other embodiments. The outer braided layer 62 can be made of metallic filaments braided together to form a generally cylindrical sheath that surrounds the inner foil 60 and provides structural support thereto. The pipe interfaces 64 can be metallic elements that provide a location for the SSHP flex joint 26A to be joined (e.g., brazed) to SSHI manifolds (not shown in FIGS. 8A-8C). In that way, the SSHP flex joint 26A allows an operable connection between different SSHP components, with a heat transfer medium present in and able to pass through the interior cavity of the SSHP flex joint 26A. Components operably connected to opposite ends of the SSHP flex joint 26A can be repositioned relative to each other by flexing and folding the SSHP flex joint 26A. It should be noted that the SSHP flex joint 26A can be configured to be of comparable size to the SSHP or SSHP manifold to which it is operably connected. However, for some applications it may be desirable for the SSHP flex joint 26A to be slightly oversized with respect to the SSHP components to which it is attached, in order to help ensure that the interior cavity is sufficiently large even if some plastic deformation occurs when temporarily placed in the folded state that affects the shape of the SSHP flex joint 26A in the normal operation state.

FIGS. 9A-9C show a second embodiment of a SSHP flex joint 26B that includes an inner foil 60, an outer braided layer 62', and pipe interfaces 64. FIG. 9A is a plan view of the SSHP flex joint 26B in a normal operational state, FIG. 9B is an end view of the SSHP flex joint 26B in the normal operational state, and FIG. 9C is a plan view of the SSHP flex joint 26B in a folded state. The SSHP flex joint 26B is generally similar to the SSHP flex joint 26A, except that the outer braided layer 62' of the SSHP flex joint 26B has a looser braid than the outer braided layer 62 of the SSHP flex joint 26A. The outer braided layer 62' can provide gaps between individual filaments of the braid.

FIGS. 10A-10C show a third embodiment of a SSHP flex joint 26C that includes an inner foil 60, pipe interfaces 64, and supports 66A-66D. FIG. 10A is a plan view of the SSHP flex joint 26C in a normal operational state, FIG. 10B is an end view of the SSHP flex joint 26C in the normal operational state, and FIG. 10C is a plan view of the SSHP flex joint 26C in a folded state. The SSHP flex joint 26C is generally similar to the SSHP flex joints 26A and 26B, except that instead of an outer braided layer the SSHP flex joint 26C includes four equally circumferentially spaced supports 66A-66D. In further embodiments, fewer or great numbers of supports can be provided, and the supports need not be equally spaced. Each of the supports 66A-66D can be an elongate, arcuate strip of metallic material, and the supports 66A-66D can be arranged such that the curvature of each faces the same direction (clockwise or counterclockwise) about the inner foil 60.

FIGS. 11A-11C show a fourth embodiment of a SSHP flex joint 26D that includes an inner foil 60' and pipe interfaces 64. The SSHP flex joint 26D is generally similar to the SSHP flex joints 26A-26C, except that instead of an outer braided layer or spaced supports the SSHP flex joint 26D there is only a corrugated inner foil 60'. The inner foil 60' can be corrugated along substantially its entire length, or a portion thereof, to allow for flexure-like a flexible drinking straw or the like.

Figure 12:
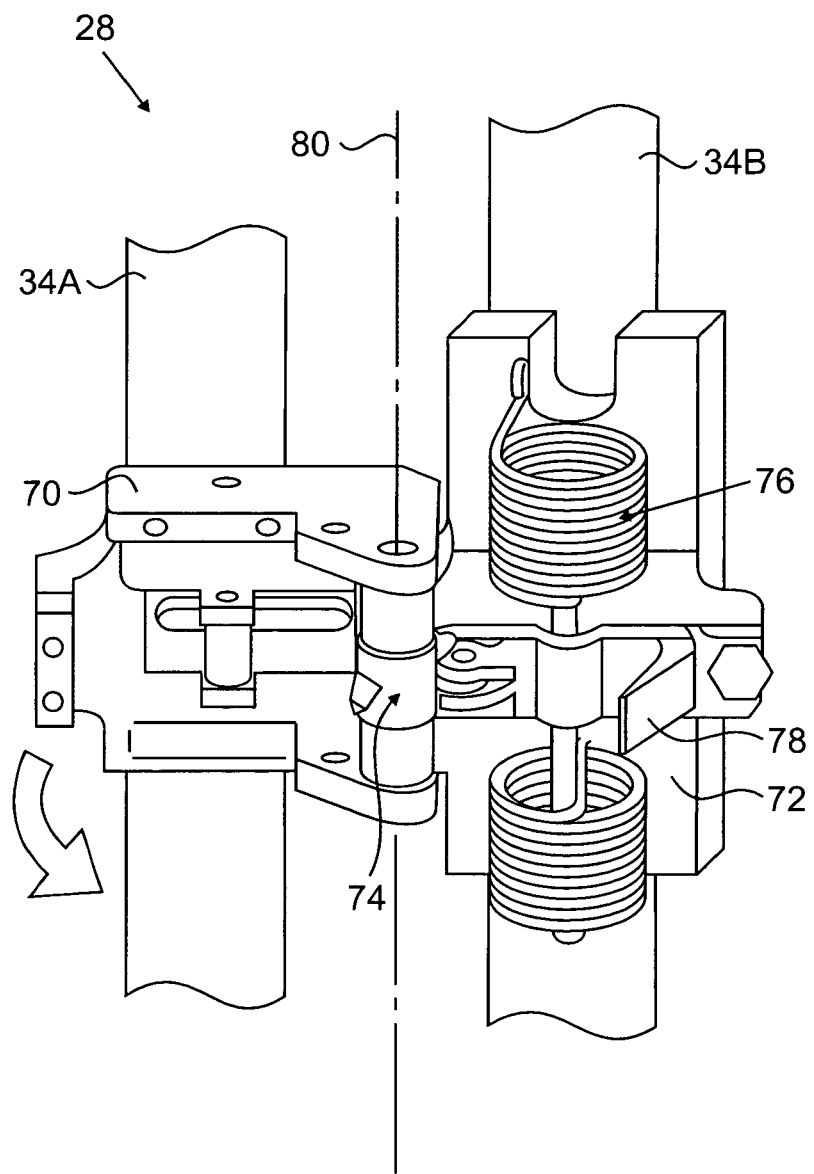
FIG. 12 is a perspective view of an exemplary hinge assembly.

FIG. 12 is a perspective view of an exemplary hinge assembly 28 that includes a first portion 70, a second portion 72, a cam mechanism 74, a biasing member 76 (e.g., a coil spring), and a latch mechanism 78. The first portion 70 can be mechanically attached to a first panel assembly, represented in FIG. 12 by a first fin 34A, and the second portion 72 can be mechanically attached to a second panel assembly, represented in FIG. 12 by a second fin 34B. The hinge assembly 28 allows panel assemblies to be selectively moved between stowed and deployed positions. In FIG. 12, the hinge assembly 28 is shown in a stowed position, such that the panel assemblies including the fins 34A and 34B are arranged substantially parallel to one another. In the stowed configuration, the panel assemblies can be folded upon each other in the manner of a folded map—it should be noted that to accomplish this the hinge assemblies 28 on either side of a given panel assembly should have opposite orientations to hingedly pivot in opposite directions (clockwise or counterclockwise). Upon deployment, the biasing member 76 and the cam mechanism 74 can cause a relative pivoting movement between the first portion 70 and second portion 72 about an axis 80. The latch mechanism 78 can then secure the first portion 70 and the second portion 72 together, to reduce a risk of further pivoting movement about the axis 80. In the deployed state, the panel assemblies including the fins 34A and 34A can be arranged substantially in the same plane, or in a different configuration as desired. The hinge assembly 28 provides mechanical, structural support between adjacent panels, and can help reduce loading on the SSHP flex joints 26. Suitable hinge assemblies like the hinge assembly 28 are commercially available from ATK Space Systems, Herndon, Va. Other hinge assemblies can be used in alternative embodiments. For example, other spring-biased, hydraulic, or pneumatic mechanisms can be used.

The space power system 20 can be fabricated as follows. The SSHPs 30 and SSHP manifolds 32 can be extruded, the fins 34 and the retention sleeves 50 woven, and the SSHP flex joints 26 and hinge assemblies 28 assembled. The SSHPs 30, the SSHP manifolds 32 and the SSHP flex joints 26 can be joined together (e.g., brazed together). The SSHP components can then be "charged", which is a process that involves cleaning the components, creating a vacuum, applying coatings of the heat transfer medium, hermetically sealing SSHP components, adding heat to activate the heat transfer medium, etc. The particular steps required to charge a SSHP component may vary depending upon the particular heat transfer medium involved. However, the process of "charging" generally refers to activating the heat transfer medium in the SSHP components for operation. The fins 34 and the retention sleeves 50 can then be positioned about the SSHP components and adhered thereto. Because of the nature of SSHP components, which tend to transfer thermal energy quickly, brazing and other high temperature operations are generally not possible once a SSHP component has been charged. Therefore, the use of adhesives to secure the woven material to the SSHP components can be used. Alternatively, the woven material of the fins 34 and the retention sleeves 50 can be secured to the SSHP components prior to charging, to enable temperature-dependent joining processes to be used.

Figure 14:
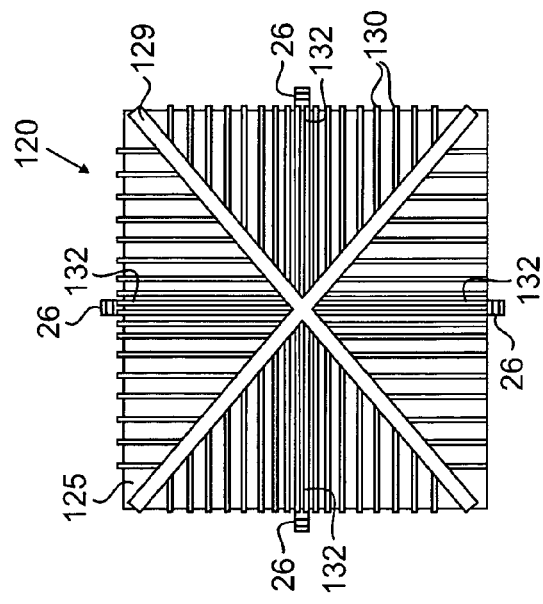
FIG. 14 is a bottom view of the space power system of FIG. 13.
Figure 13:
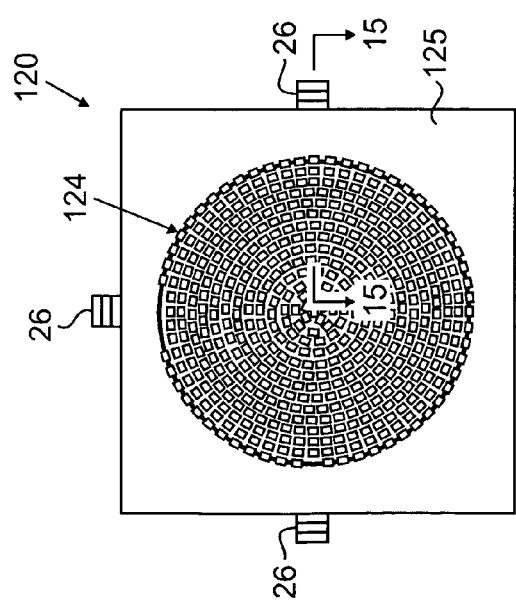
FIG. 13 is a plan view of a portion of another embodiment of a space power system.
Figure 15:
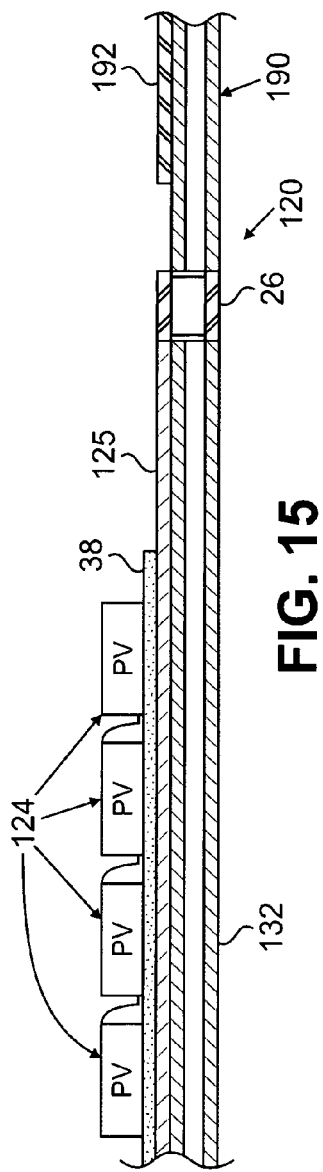
FIG. 15 is a cross-sectional view of the space power system of FIGS. 13 and 14, taken along line 15-15 in FIG. 13.

FIGS. 13-15 illustrate another embodiment of a space power system 120. FIG. 13 is a plan view of a portion of the space power system 120, FIG. 14 is a bottom view of the portion of the space power system 120, and FIG. 15 is a cross-sectional view of the space power system 120 taken along line 15-15 in FIG. 13. In the illustrated embodiment the system 120 includes SSHP flex joints 26, an array of PVCs 124, a cold plate 125, a SSHP spread manifold 129, SSHPs 130, and four SSHP manifolds 132. The array of PVCs 124 can be configured as concentric rows of individual PVC units or conventional configurations, and can be arranged to receive light from an optical concentrator (not shown). The array of PVCs 124 can also be adhered to the cold plate 125 with an adhesive 38 (e.g., Kapton® tape). The cold plate 125 can be configured as a rectangular, substantially planar element made of a metallic material that can readily conduct heat, such as aluminum. In one embodiment, the cold plate 125 is substantially square with a length and width of about 1.5 m and a thickness of about 1.3 mm.

The SSHP spread manifold 129, the SSHPs 130, and the SSHP manifolds 132 are all arranged on a bottom side of the cold plate 125, opposite the PVC array 124. The SSHP spread manifold 129 can be formed in an "X" shape, with a central juncture at a center portion of the cold plate 125 and arms that extend to corners of the cold plate 125. The SSHPs 130 are operably connected to the SSHP spread manifold 129, and extend from opposite sides of the SSHP spread manifold 129 to a perimeter of the cold plate 125. The four SSHP manifolds 132 extend from the central junction of the SSHP spread manifold 129 to the perimeter of the cold plate 125, with each SSHP manifold 132 positioned in between two arms of the SSHP spread manifold 129. One SSHP flex joint 26 is connected to each of the SSHP manifolds 132 at the perimeter of the cold plate 125. During operation, waste heat can be collected by the SSHPs 130 and transferred to the SSHP spread manifold 129, which can in turn transfer the waste heat to the SSHP manifolds 132 for rejection. This helps keep the PVC array 124 relatively cool.

As shown in FIG. 15 (but omitted from FIGS. 13 and 14 for simplicity), a heat rejection panel 190 can be operatively connected to each of the SSHP flex joints 26. The heat rejection panel 190 can have a configuration similar to any of the panel assemblies 22 and 42 described above, or a different configuration. For instance, the heat rejection panels 190 can have non-planar, curved shapes in order to integrate optical concentrators 192 thereupon.

Figure 16:
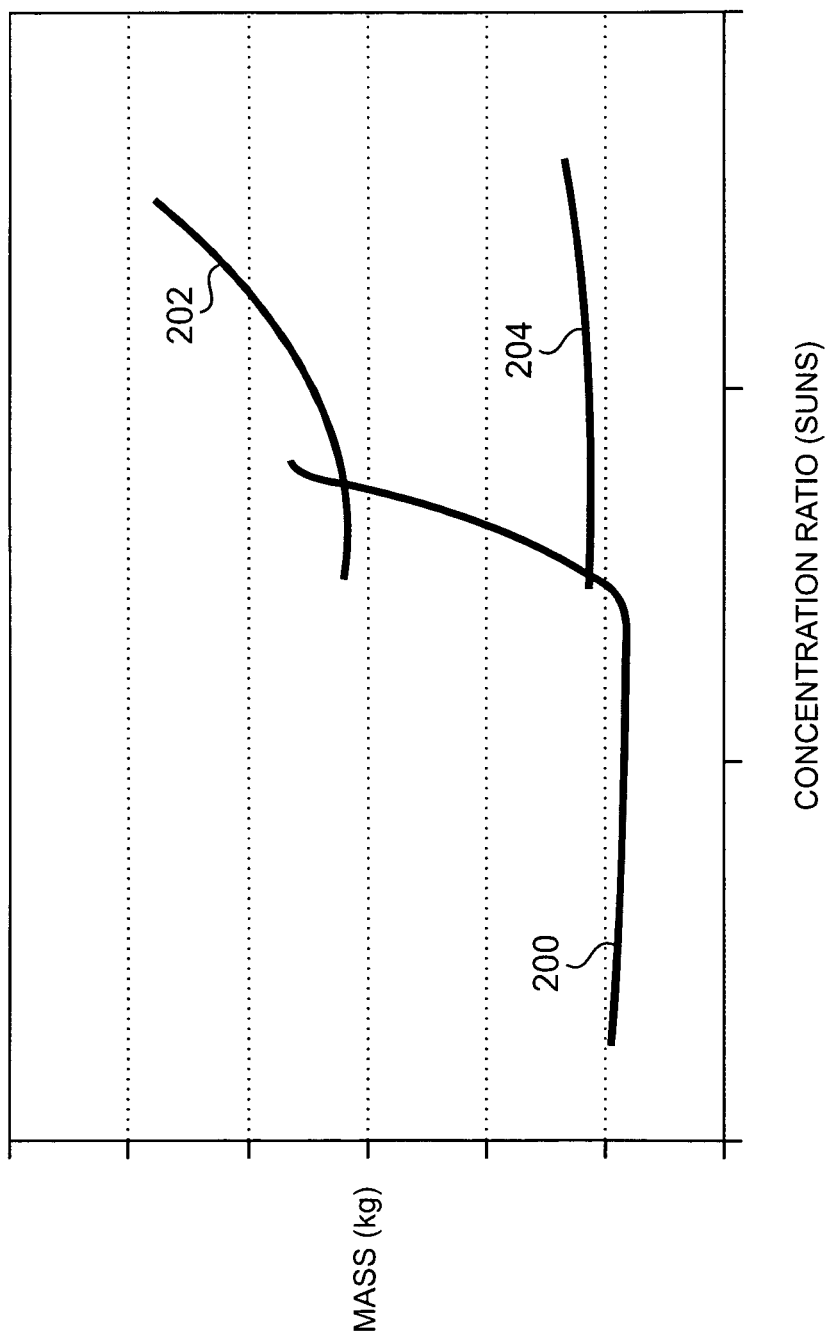
FIG. 16 is a graph of mass versus concentration ratio comparing different heat rejection systems.

It will be recognized that the present invention provides numerous advantages and benefits. For example, the FIG. 16 is a graph of mass (in kg) versus concentration ratio (in suns) comparing different heat rejection systems, with plots representing heat rejection system capacity to reject heat at a given concentration ratio and an associated mass of the heat rejection system at the given concentration ratio. A first plot 200 represents a carbon fin 34, a second plot 202 represents a prior art liquid heat pipe with copper walls and water as the working medium, and a third plot 204 represents a SSHP with titanium walls according to the present invention. It has been found that a heat rejection system according to the present invention using SSHP components can reject heat at concentration levels at or greater than those of prior art systems, with less associated heat rejection system mass. This allows, for instance, space power systems to be optimized for operation at relatively high concentration ratios without exceeding a mass limit associated with a launch of the system into space, which was not feasible with prior art systems.

Although the present invention has been described with reference to preferred embodiments, workers skilled in the art will recognize that changes may be made in form and detail without departing from the spirit and scope of the invention. For example, tubular pipes and flex joints utilized with the present invention can have nearly any cross-sectional shape. Moreover, a composition of the solid state heat transfer medium utilized can vary as desired. Also, the solid state heat pipe heat rejection system of the present invention can be utilized with any type of heat source, for example, alternative heat sources can include solar or nuclear power conversion cycles and/or power electronics.

The invention claimed is:

1. A heat rejection system comprising:
    a plurality of panel subassemblies, each panel subassembly comprising:
        a planar fin;
        a solid state heat pipe manifold;
        a first solid state heat pipe tube operatively connected to the solid state heat pipe manifold and secured to the fin; and
        a second solid state heat pipe tube operatively connected to the solid state heat pipe manifold adjacent to the first solid state heat pipe and secured to the fin; and
    a solid state heat pipe flex joint operably connecting the solid state heat pipe manifolds of two of the plurality of panel subassemblies in a hermetically sealed configuration, wherein the solid state heat pipe flex joint is configured to permit repositioning of the two panel subassemblies relative to each other.

2. The system of claim 1, wherein the fin comprises a web of carbon fiber material.

3. The system of claim 1, wherein the first solid state heat pipe includes a wall comprising titanium.

4. The system of claim 1, wherein the first solid state heat pipe tube is longer than the second solid state heat pipe tube.

5. The system of claim 1, wherein a perimeter of the fin of each panel subassembly is hexagonal, wherein the first solid state heat pipe tube is longer than the second solid state heat pipe tube, and wherein the second solid state heat pipe tube is positioned adjacent to three edges of the perimeter of the fin.

6. The system of claim 1, wherein the first solid state heat pipe tube is oriented at approximately a right angle to the solid state heat pipe manifold.

7. The system of claim 1, wherein the first and second solid state heat pipe tubes are oriented substantially parallel to one another, and wherein central axes of both the first and second solid state heat pipe tubes are positioned co-planar with the fin.

8. The system of claim 1, wherein the solid state heat pipe manifold comprises a D-shaped tube.

9. The system of claim 1, wherein the solid state heat pipe manifold comprises integrally formed first and second D-shaped tubes arranged adjacent one another in a substantially parallel configuration, wherein the first and second D-shaped tubes are each operably connected to both the first and second solid state heat pipes.

10. The system of claim 9, wherein the first solid state heat pipe is operably connected to each of the first and second D-shaped tubes.

11. The system of claim 1, wherein the solid state heat pipe flex joint comprises:
    an inner foil capable of temporarily deforming to a folded position for stowage and capable of reopening to tubular configuration for normal operation; and
    a braided outer layer positioned outside the inner foil for providing structural support to the inner foil.

12. The system of claim 1, wherein the solid state heat pipe flex joint comprises:
    an inner foil capable of temporarily deforming to a folded position for stowage and capable of reopening to tubular configuration for normal operation; and
    a plurality of support members spaced from one another about a center axis and positioned outside the inner foil for providing structural support to the inner foil.

13. The system of claim 1, wherein the solid state heat pipe flex joint comprises:
    a foil capable of temporarily deforming to a folded position for stowage and capable of reopening to tubular configuration for normal operation, wherein a wall of the foil has a corrugated configuration.

14. The system of claim 1 and further comprising:
    a retention sleeve secured to the fin and made from a material substantially the same as that of the fin, wherein the first solid state heat pipe is positioned within the retention sleeve.

15. The system of claim 14, wherein the first solid state heat pipe is adhered to the retention sleeve.

16. The system of claim 1, wherein the fins of the two panel subassemblies are arranged in a co-planar configuration for operation.

17. The system of claim 1, wherein the fins of the two panel subassemblies are arranged substantially parallel to one another for stowage within a launch vehicle faring dynamic envelope.

18. The system of claim 1 and further comprising:
    a hinge assembly mechanically linking panel subassemblies.

19. A heat rejection system for use in space, the system comprising:
    a first panel subassembly comprising:
        a first fin, wherein the first fin is planar;
        a first solid state heat pipe manifold;
        a first solid state heat pipe tube operatively connected to the first solid state heat pipe manifold and secured to the first fin; and
        a second solid state heat pipe tube operatively connected to the first solid state heat pipe manifold adjacent to the first solid state heat pipe and secured to the first fin;
    a second panel subassembly comprising:
        a second fin, wherein the second fin is planar;
        a second solid state heat pipe manifold;
        a third solid state heat pipe tube operatively connected to the second solid state heat pipe manifold and secured to the second fin; and
        a fourth solid state heat pipe tube operatively connected to the second solid state heat pipe manifold adjacent to the third solid state heat pipe and secured to the second fin; and
    a solid state heat pipe flex joint operably connecting the first and second solid state heat pipe manifolds in a hermetically sealed configuration, wherein the solid state heat pipe flex joint is configured to permit repositioning of the first and second panel subassemblies relative to each other.

20. A heat rejection system comprising:
    a first solid state heat pipe structure;
    a second solid state heat pipe structure;
    a planar fin, wherein the first and second solid state heat pipe structures are secured to the fin, wherein the first and second solid state heat pipe structures are each tubular in shape and central axes of both the first and second solid state heat pipe structures are positioned co-planar with the fin;
    a solid state heat transfer medium; and
    a solid state heat pipe flex joint operably connecting the first and second solid state heat pipe structures to define a common internal cavity in which the solid state heat transfer medium is disposed, wherein the common internal cavity is hermetically sealed, wherein the solid state heat pipe flex joint is configured to permit repositioning of the first and second solid state heat pipe structures relative to each other, and wherein the solid state heat pipe flex joint comprises:
- an inner foil capable of temporarily deforming to a folded position for stowage and capable of reopening to a tubular configuration for normal operation; and
- a braided outer layer positioned outside the inner foil for providing structural support to the inner foil to return the solid state heat pipe flex joint to the tubular configuration and form an interior cavity for normal operation and passage of the solid state heat transfer medium therethrough.

21. The system of claim 1 and further comprising:
a solid state heat pipe working medium sealed within each panel subassembly and the solid state heat pipe flex joint.

22. The system of claim 9, wherein the first and second D-shaped tubes each have a substantially planar exterior portion, and wherein the substantially planar portions of the first and second D-shaped tubes are positioned in a co-planar arrangement.

23. The system of claim 12, wherein at least one of the plurality of support members comprises an arcuate strip.

24. The system of claim 19, wherein a perimeter of the fin of the first panel subassembly is hexagonal, wherein the first solid state heat pipe tube of the first panel subassembly is longer than the second solid state heat pipe tube of the first panel subassembly, and wherein the second solid state heat pipe tube is positioned adjacent to three edges of the perimeter of the fin of the first panel subassembly.

* * * * *